United States Patent
Shi et al.

(10) Patent No.: US 12,490,525 B2
(45) Date of Patent: Dec. 2, 2025

(54) NORMAL-INCIDENT PHOTODIODE STRUCTURE WITH DARK CURRENT SELF-COMPENSATION FUNCTION

(71) Applicant: SiFotonics Technologies (Beijing) Co., Ltd., Beijing (CN)

(72) Inventors: Bin Shi, Beijing (CN); Fan Qi, Beijing (CN); Pengfei Cai, Beijing (CN)

(73) Assignee: SiFotonics Technologies (Beijing) Co., Ltd., Beijing (CN)

( * ) Notice: Subject to any disclaimer, the term of this patent is extended or adjusted under 35 U.S.C. 154(b) by 422 days.

(21) Appl. No.: 18/088,817

(22) Filed: Dec. 27, 2022

(65) Prior Publication Data
US 2023/0238403 A1 Jul. 27, 2023

(30) Foreign Application Priority Data
Jan. 21, 2022 (CN) .......................... 202210074447.8

(51) Int. Cl.
*H10F 39/10* (2025.01)
*H10F 30/225* (2025.01)
*H10F 77/122* (2025.01)
*H10F 77/30* (2025.01)

(52) U.S. Cl.
CPC ....... *H10F 39/103* (2025.01); *H10F 30/2255* (2025.01); *H10F 77/122* (2025.01); *H10F 77/334* (2025.01)

(58) Field of Classification Search
CPC .. H10F 39/103; H10F 39/107; H10F 30/2255; H10F 77/122; H10F 77/334; H10F 77/206; H10F 77/953; H01L 25/042
See application file for complete search history.

(56) References Cited

U.S. PATENT DOCUMENTS

| | | | | |
|---|---|---|---|---|
| 2003/0071196 A1* | 4/2003 | Seitz | ..................... | H10F 39/103 |
| | | | | 257/E27.128 |
| 2010/0060562 A1* | 3/2010 | Hadwen | ................... | G01J 1/44 |
| | | | | 250/208.2 |
| 2013/0294766 A1* | 11/2013 | Cai | ........................ | H04B 10/40 |
| | | | | 438/69 |

FOREIGN PATENT DOCUMENTS

CN 108829171 A 11/2018

* cited by examiner

*Primary Examiner* — Sitaramarao S Yechuri

(57) ABSTRACT

The present invention provides a normal-incident photodiode structure with a dark current self-compensation function, including a photosensitive photodiode and a compensating photodiode, where a photosensitive surface of the compensating photodiode is provided with a light-blocking layer, and dark currents of the photosensitive photodiode and the compensating photodiode are equal. According to the present invention, the dark current self-compensation function may be implemented at a chip level without an external circuit and an operational amplifier; the normal-incident photodiode structure according to the present invention has the photosensitive photodiode and the compensating photodiode, and the compensating photodiode may counteract the dark current of the photosensitive photodiode during operation, thus reducing noise caused by the dark current of the photosensitive photodiode; and bias voltages of the photosensitive photodiode and the compensating photodiode according to the present invention are controlled separately, and thus may be applied to more usage scenarios.

6 Claims, 2 Drawing Sheets

NORMAL-INCIDENT PHOTODIODE STRUCTURE WITH DARK CURRENT SELF-COMPENSATION FUNCTION

TECHNICAL FIELD

The present invention relates to the field of photoelectric detector technologies, and in particular, to a normal-incident photodiode structure with a dark current self-compensation function.

BACKGROUND

A photodiode, as a core device of a photoelectric sensor, may be used for distance detection, contact alarm, gesture recognition, and the like. In these applications, the photodiode receives scattered signal light and converts an optical signal into an electrical signal for output. A harvesting capability and photoelectric conversion efficiency of the photodiode for the scattered signal light are two key factors throughout the receiving process. To improve the foregoing two performances, the most common solution in a current design is to increase an aperture of the photodiode and a thickness of an absorbing layer, but increasing the aperture and thickening the absorbing layer will remarkably increase a dark current of the photodiode, thus increasing noise. To solve the foregoing technical problem, the patent document No. CN108829171A discloses a device and method for eliminating a dark current of a monitor diode, but the elimination of the dark current requires an external circuit in conjunction with an adjustable resistor and an operational amplifier, so the processing efficiency is low. In addition, two photodiodes used in the patent No. CN108829171A are directly connected to an adjustable resistor in series, and then connected to a 5 V bias voltage, so that the two photodiodes are linked in an adjusting process. Bias voltages and operating states of the photodiodes are limited to eliminate the dark current.

SUMMARY

To solve the foregoing technical problem, the present invention provides a normal-incident photodiode structure with a dark current self-compensation function. The following provides a brief overview to gain a basic understanding of some aspects of the disclosed embodiments. The overview is not a general review, and is not intended to determine key/important components or describe the protection scope of these embodiments. The only objective thereof is to present some concepts in a simple form as a preface to the detailed explanations that follow.

The present invention employs the following technical solution:

In some optional embodiments, the present invention provides a normal-incident photodiode structure with a dark current self-compensation function, including a photosensitive photodiode and a compensating photodiode, where the compensating photodiode is connected in series with the photosensitive photodiode via an electrode, a photosensitive surface of the compensating photodiode is provided with a light-blocking layer, and dark currents of the photosensitive photodiode and the compensating photodiode are equal.

Further, an anode of the photosensitive photodiode is connected to a cathode of the compensating photodiode, or a cathode of the photosensitive photodiode is connected to an anode of the compensating photodiode; and an end of the photosensitive photodiode connected to the compensating photodiode is taken as a signal output end of the normal-incident photodiode structure.

Further, the photosensitive photodiode and the compensating photodiode are Ge/Si photodiodes or Ge/Si avalanche photodiodes.

Further, the photosensitive photodiode and the compensating photodiode each use silicon wafer or silicon on insulator (SOI) wafer as a substrate, a layer of N-doped silicon as a cathode connecting layer, a layer of P-doped silicon as an anode connecting layer, and germanium, or silicon, or germanium-silicon, or other III-V materials as an absorbing layer. The light-blocking layer could be any material, such as metal, dielectric, or organic polymer layer, which could reflect the working wavelength light and thus protect the reference photodiode from being illuminated.

Further, when the photosensitive photodiode and the compensating photodiode are avalanche photodiodes, a layer of intrinsic silicon is used as a multiplication layer, and a layer of P-doped silicon is used as a charge layer.

Further, that the dark currents of the photosensitive photodiode and the compensating photodiode are equal refers to all cases in which the dark currents of the photosensitive photodiode and the compensating photodiode are equal, including but not limited to the following cases:

when the photosensitive photodiode and the compensating photodiode have the same structure, shape and operating bias voltage, the dark currents are equal;

when the photosensitive photodiode and the compensating photodiode have different structures and shapes, but differences in structure and shape have no impact on dark current values of the photosensitive photodiode and the compensating photodiode at the same bias voltage, and the photosensitive photodiode and the compensating photodiode have the same operating bias voltage, the dark currents are equal; and when the photosensitive photodiode and the compensating photodiode have different structures and shapes, and differences in structure and shape make dark current values of the photosensitive photodiode and the compensating photodiode different at the same bias voltage, the dark currents are enabled to be equal by adjusting respective operating bias voltages.

The present invention has the following beneficial effects:

1. The normal-incident photodiode structure according to the present invention can self-compensate the dark current at a chip level without an external circuit and an operational amplifier, so the processing efficiency is high, and can avoid unstable factors caused by the introduction of other devices.

2. The normal-incident photodiode structure according to the present invention has the photosensitive photodiode and the compensating photodiode, the compensating photodiode can counteract the dark current of the photosensitive photodiode during operation, thus reducing noise caused by the dark current of the photosensitive photodiode.

3. The bias voltages of the photosensitive photodiode and the compensating photodiode according to the present invention are controlled separately, and thus may be applied to more usage scenarios.

DETAILED DESCRIPTION OF EMBODIMENTS

The following description and accompanying drawings fully present specific implementation solutions of the present invention, so that a person skilled in the art can practice them. Other implementation solutions may include structural, logic, electrical, procedural and other variations. Embodiments merely typify possible variations. Unless expressly required, separate components and functions are optional, and the order of operation may be varied. Portions and features of some implementation solutions may be included in, or replaced with, those of other implementation solutions.

Figure 1:
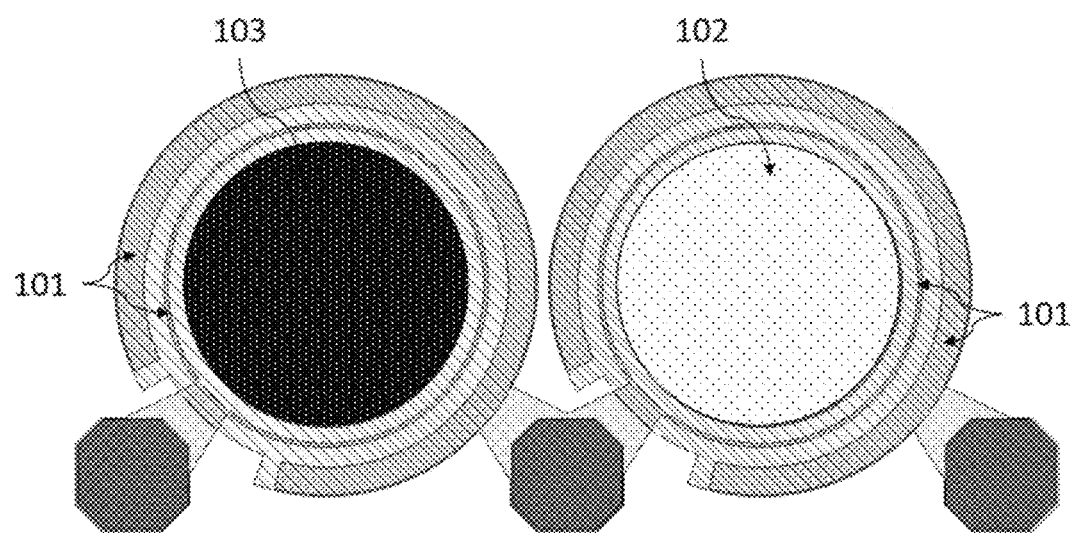
FIG. 1 is a schematic diagram of a normal-incident photodiode structure with a dark current self-compensation function according to the present invention.
Figure 2:
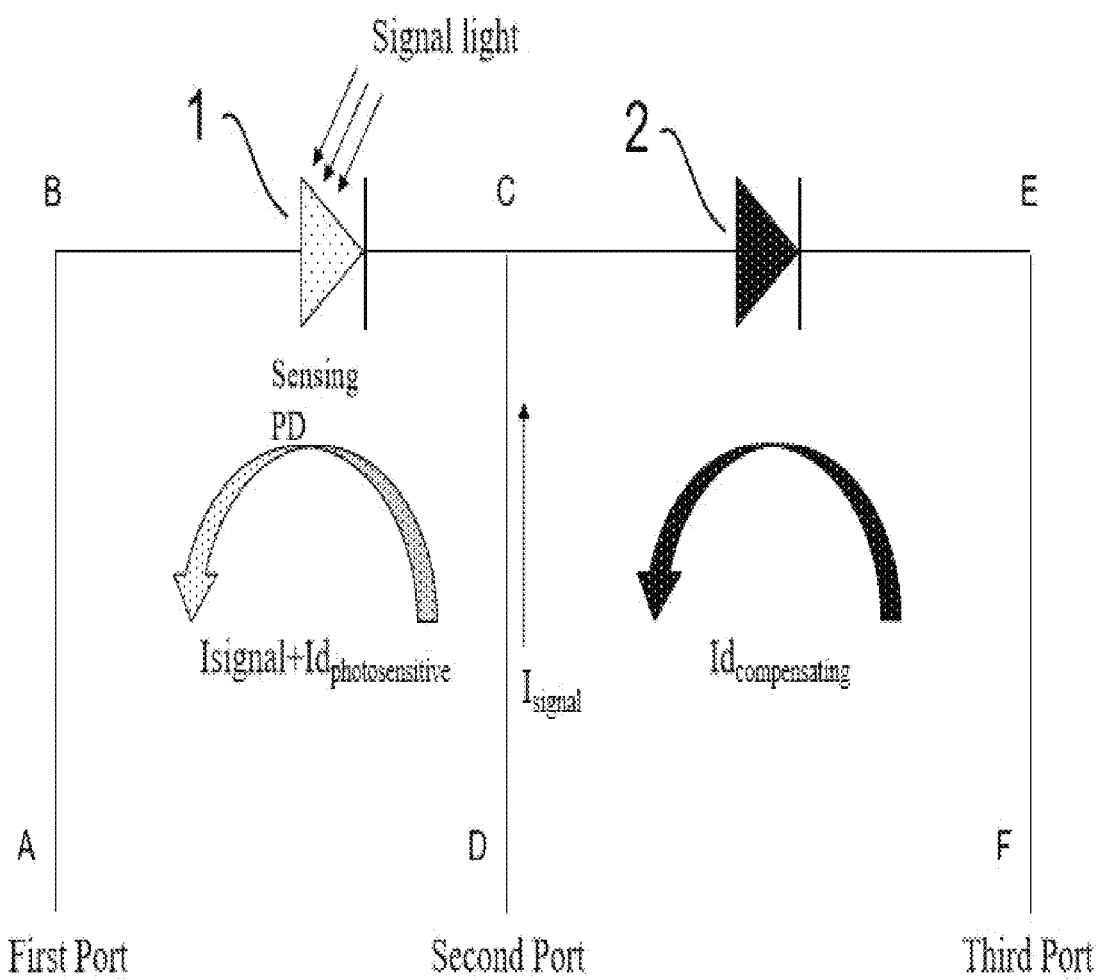
FIG. 2 is an equivalent circuit diagram of a normal-incident photodiode structure with a dark current self-compensation function according to the present invention.

As shown in FIG. 1 to FIG. 2, in some illustrative embodiments, the present invention provides a normal-incident photodiode structure with a dark current self-compensation function, including a photosensitive photodiode 1 and a compensating photodiode 2.

The photosensitive photodiode 1 receives signal light via a photosensitive surface 102, and converts an optical signal into an electrical signal.

A photosensitive surface of the compensating photodiode 2 is provided with a light-blocking layer 103. Therefore, the compensating photodiode 2 does not receive signal light, but merely serves to compensate for the dark current in real time. The light-blocking layer 103 is a layer of opaque substance in a diode operating waveband, so that no stray signal light can penetrate, so as to ensure that the dark current output by the compensating photodiode 2 at any time is a dark current of the compensating photodiode, and that the dark current can be directly and accurately eliminated when the photosensitive photodiode 1 and the compensating photodiode 2 are used together.

The opaque substance used for the light-blocking layer 103 may by any medium, metal, structure, or other materials through which the signal light cannot penetrate. Specifically, the signal light may be reflected or absorbed.

The compensating photodiode 2 is connected in series with the photosensitive photodiode 1 via an electrode 101, an anode of the photosensitive photodiode 1 is connected to a cathode of the compensating photodiode 2, or a cathode of the photosensitive photodiode 1 is connected to an anode of the compensating photodiode 2. The connection between the photosensitive photodiode 1 and the compensating photodiode 2 refers to that the photosensitive photodiode 1 and the compensating photodiode 2 share the same electrode or are connected by means of wire bonding.

The dark currents of the photosensitive photodiode 1 and the compensating photodiode 2 are equal, namely $Id_{photosensitive} = Id_{compensating}$, where $Id_{photosensitive}$ is the dark current of the photosensitive photodiode 1, and $Id_{compensating}$ is the dark current of the compensating photodiode 2.

FIG. 2 illustrates the connection between the cathode of the photosensitive photodiode 1 and the anode of the compensating photodiode 2, and the connection between the anode of the photosensitive photodiode 1 and the cathode of the compensating photodiode 2 has the same operating principle, and thus falls into the protection scope of the present invention. In FIG. 2, a voltage of a first port is V1, a voltage of a second port is V2, and a voltage of a third port is V3.

A bias voltage of the photosensitive photodiode 1 is a potential difference between the second port and the first port, that is, the bias voltage of the photosensitive photodiode is V2−V1; a current output by the photosensitive photodiode 1 is a sum of a signal light current and the dark current of the photosensitive photodiode, namely, $I_{signal} + Id_{photosensitive}$, and a direction is D→C→B→A.

A bias voltage of the compensating photodiode 2 is a potential difference between the second port and the third port, that is, the bias voltage of the compensating photodiode is V3−V2; and a current output by the compensating photodiode 2 is the dark current of the compensating photodiode, namely, $Id_{compensating}$, and a direction is F→E→C→D.

Therefore, for a branch circuit where the second port is located, the dark currents of the photosensitive photodiode 1 and the compensating photodiode 2 are equal in magnitude but opposite in direction, thus counteracting with each other. A total current through the second port is $I_{signal}$, which eliminates the impact of the dark current of the photosensitive photodiode 1 on a signal-to-noise ratio. An end of the photosensitive photodiode 1 connected to the compensating photodiode 2 may be taken as a signal output end of the normal-incident photodiode structure.

The photosensitive photodiode 1 and the compensating photodiode 2 are Ge/Si photodiodes or Ge/Si avalanche photodiodes, and feature the following:
  first, silicon is used as a substrate;
  second, a layer of N-doped silicon is used as a cathode connecting layer;
  third, a layer of P-doped silicon is used as an anode connecting layer;
  fourth, germanium is used as an absorbing layer; and
  fifth, when the photosensitive photodiode and the compensating photodiode are avalanche photodiodes, a layer of intrinsic silicon is used as a multiplication layer, and a layer of P-doped silicon is used as a charge layer.

This ensures that the normal-incident photodiode structure according to the present invention has a relatively high light-harvesting capacity and photoelectric conversion efficiency.

That the dark currents of the photosensitive photodiode 1 and the compensating photodiode 2 are equal refers to all cases in which the dark currents of the photosensitive photodiode 1 and the compensating photodiode 2 are equal, including but not limited to the following cases:
  in the first case, when the photosensitive photodiode 1 and the compensating photodiode 2 have same structure, shape and operating bias voltage, the dark currents are equal, and thus the dark currents can be eliminated completely;
  in the second case, when the photosensitive photodiode 1 and the compensating photodiode 2 have different structures and shapes, but differences in structure and shape have no impact on dark current values of the photosensitive photodiode and the compensating photodiode at the same bias voltage, and the photosensitive photodiode and the compensating photodiode have the same operating bias voltage, the dark currents are equal, and thus the dark currents can be eliminated completely; and
  in the third case, when the photosensitive photodiode 1 and the compensating photodiode 2 have different structures and shapes, and differences in structure and shape make dark current values of the photosensitive photodiode and the compensating photodiode different at the same bias voltage, the dark currents are enabled to be equal by adjusting respective operating bias voltages, and thus the dark currents can also be eliminated completely.

A person skilled in the art should further understand that electronic hardware, computer software or a combination thereof may be implemented in conjunction with various illustrative logic blocks, modules, circuits and algorithm steps described in the embodiments herein. To illustrate interchangeability between the hardware and the software, various illustrative parts, blocks, modules, circuits and steps have been described above generally in terms of functions thereof. Whether the functions are implemented as hardware or software depends on specific applications and design constraints applied to the entire system. Skilled technicians may implement the described functions in varying ways for each particular application, but such implementation decisions should not be interpreted as a departure from the protection scope of the present disclosure.

The invention claimed is:

1. A normal-incident photodiode structure with a dark current self-compensation function, comprising a photosensitive photodiode and a compensating photodiode,
   wherein the photosensitive photodiode and the compensating photodiode are Ge/Si photodiodes or Ge/Si avalanche photodiodes;
   wherein the compensating photodiode is connected in series with the photosensitive photodiode via an electrode, an end of the photosensitive photodiode connected to the compensating photodiode is taken as a signal output end of the normal-incident photodiode structure;
   a photosensitive surface of the compensating photodiode is provided with a light-blocking layer so that the dark current output by the compensating photodiode at any time is a dark current of the compensating photodiode, and dark currents of the photosensitive photodiode and the compensating photodiode are equal;
   when the photosensitive photodiode and the compensating photodiode have different structures and shapes, and differences in the structure and shapes make dark current values of the photosensitive photodiode and the compensating photodiode different at the same bias voltage, the dark currents are enabled to be equal by adjusting respective operating bias voltages.

2. The normal-incident photodiode structure with a dark current self-compensation function according to claim 1, wherein an anode of the photosensitive photodiode is connected to a cathode of the compensating photodiode, or a cathode of the photosensitive photodiode is connected to an anode of the compensating photodiode.

3. The normal-incident photodiode structure with a dark current self-compensation function according to claim 1, wherein the photosensitive photodiode and the compensating photodiode use silicon wafer or silicon on insulator (SOI) wafer as a substrate, a layer of N-doped silicon as a cathode connecting layer, a layer of P-doped silicon as an anode connecting layer, and germanium, or silicon, or germanium-silicon, or other III-V materials as an absorbing layer, wherein the light-blocking layer is a material of metal, dielectric, or organic polymer layer, which reflects the working wavelength light and thus protect the reference photodiode from being illuminated.

4. The normal-incident photodiode structure with a dark current self-compensation function according to claim 3, wherein when the photosensitive photodiode and the compensating photodiode are avalanche photodiodes, a layer of intrinsic silicon is used as a multiplication layer, and a layer of P-doped silicon is used as a charge layer.

5. The normal-incident photodiode structure with a dark current self-compensation function according to claim 1, wherein the case of the dark currents of the photosensitive photodiode and the compensating photodiode further comprises:
   when the photosensitive photodiode and the compensating photodiode have the same structure, shape and operating bias voltage, the dark currents are equal.

6. The normal-incident photodiode structure with a dark current self-compensation function according to claim 1, wherein the case of the dark currents of the photosensitive photodiode and the compensating photodiode further comprises:
   when the photosensitive photodiode and the compensating photodiode have different structures and shapes, but differences in the structure and shapes have no impact on dark current values of the photosensitive photodiode and the compensating photodiode at the same bias voltage, and the photosensitive photodiode and the compensating photodiode have the same operating bias voltage, the dark currents are equal.

* * * * *